United States Patent
Cheng

(12) 
(10) Patent No.: US 10,431,142 B2
(45) Date of Patent: Oct. 1, 2019

(54) PIXEL CIRCUIT AND ELECTROLUMINESCENT DISPLAY COMPRISING THE PIXEL CIRCUIT

(71) Applicant: INT TECH CO., LTD., Taipei (TW)

(72) Inventor: Shih-Song Cheng, Kaohsiung (TW)

(73) Assignee: INT TECH CO., LTD., Taipei (TW)

( * ) Notice: Subject to any disclaimer, the term of this patent is extended or adjusted under 35 U.S.C. 154(b) by 269 days.

(21) Appl. No.: 15/439,420

(22) Filed: Feb. 22, 2017

(65) Prior Publication Data

US 2018/0137815 A1     May 17, 2018

Related U.S. Application Data

(60) Provisional application No. 62/421,435, filed on Nov. 14, 2016.

(51) Int. Cl.
    *G06F 3/038*      (2013.01)
    *G09G 5/00*      (2006.01)
    (Continued)

(52) U.S. Cl.
    CPC ......... *G09G 3/2092* (2013.01); *G06F 3/1446* (2013.01); *G09G 3/30* (2013.01);
    (Continued)

(58) Field of Classification Search
    CPC ..................... G09G 3/3233; G09G 2300/0819
    See application file for complete search history.

(56) References Cited

U.S. PATENT DOCUMENTS 6,971,470 B2    12/2005   McGoldrick
7,271,785 B2     9/2007   Jang
(Continued)

FOREIGN PATENT DOCUMENTS

CN      1571005 A     1/2005
CN      1586094 A     2/2005
(Continued)

OTHER PUBLICATIONS

Office Action and Search Report dated Dec. 19, 2017, issued in counterpart Taiwanese Patent Application No. 106129401, with English Summary. (12 pages).
(Continued)

*Primary Examiner* — Nan-Ying Yang
(74) *Attorney, Agent, or Firm* — Juan Carlos A. Marquez; Marquez IP Law Office, PLLC

(57) ABSTRACT

A circuit includes an electroluminescent (EL) device, a transistor, a first capacitor and a second capacitor. The transistor, coupled between a supply voltage and the EL device, includes a gate coupled to a first node and a first terminal coupled to a second node. The first capacitor, coupled between the first node and the second node, is configured to reset the gate of the transistor to the supply voltage in response to a first control signal. The second capacitor, including a first end coupled to the second node and a second end to receive a second control signal, is configured to establish at the first terminal of the transistor a compensation voltage associated with a threshold voltage of the transistor in response to the second control signal. The transistor is configured to pass a current through the EL device. The current has a magnitude independent of the threshold voltage of the transistor.

19 Claims, 8 Drawing Sheets

(51) Int. Cl.
  *G09G 3/30* (2006.01)
  *G09G 3/20* (2006.01)
  *H01L 27/32* (2006.01)
  *H01L 51/50* (2006.01)
  *H01L 23/528* (2006.01)
  *H01L 29/417* (2006.01)
  *H01L 29/78* (2006.01)
  *G06F 3/14* (2006.01)
  *G09G 3/3208* (2016.01)
  *G09G 3/36* (2006.01)

(52) U.S. Cl.
  CPC ........ *H01L 23/528* (2013.01); *H01L 27/3211* (2013.01); *H01L 27/3248* (2013.01); *H01L 29/41733* (2013.01); *H01L 29/78* (2013.01); *H01L 51/5036* (2013.01); *G09G 3/3208* (2013.01); *G09G 3/3611* (2013.01); *G09G 2300/026* (2013.01); *G09G 2300/0439* (2013.01); *G09G 2300/0819* (2013.01); *G09G 2310/0278* (2013.01); *G09G 2320/0204* (2013.01); *G09G 2320/029* (2013.01); *G09G 2320/0233* (2013.01); *G09G 2320/045* (2013.01); *G09G 2330/02* (2013.01); *H01L 27/3244* (2013.01)

(56) References Cited

U.S. PATENT DOCUMENTS

| | | | |
|---|---|---|---|
| 7,463,222 | B2 | 12/2008 | Fish et al. |
| 7,675,494 | B2 | 3/2010 | Hong et al. |
| 9,330,603 | B2 | 5/2016 | Kwak |
| 10,229,639 | B2 | 3/2019 | Ma |
| 10,269,294 | B2 | 4/2019 | Kwak |
| 2010/0141645 | A1* | 6/2010 | Choi ............... G09G 3/3233 345/214 |
| 2011/0090202 | A1* | 4/2011 | Han ............... G09G 3/32 345/211 |
| 2013/0088474 | A1 | 4/2013 | Wang et al. |
| 2014/0145918 | A1 | 5/2014 | Kwak |
| 2014/0313106 | A1 | 10/2014 | In et al. |
| 2015/0154906 | A1 | 6/2015 | Chung |
| 2016/0125808 | A1 | 5/2016 | Hsu et al. |
| 2016/0284270 | A1 | 9/2016 | Sun et al. |
| 2016/0379553 | A1* | 12/2016 | Cho ............... G09G 3/3233 345/76 |
| 2018/0301092 | A1 | 10/2018 | Ma |

FOREIGN PATENT DOCUMENTS

| | | |
|---|---|---|
| CN | 1679073 A | 10/2005 |
| CN | 1889159 A | 1/2007 |
| CN | 103035198 A | 4/2013 |
| CN | 103137069 A | 6/2013 |
| CN | 103150991 A | 6/2013 |
| CN | 103295519 A | 9/2013 |
| CN | 103489399 A | 1/2014 |
| CN | 103839514 A | 6/2014 |
| CN | 103903556 A | 7/2014 |
| CN | 104036732 A | 9/2014 |
| CN | 104464635 A | 3/2015 |
| CN | 104575377 A | 4/2015 |
| CN | 104916257 A | 9/2015 |
| CN | 105206222 B | 12/2015 |
| CN | 105336292 B | 2/2016 |
| CN | 105427803 A | 3/2016 |
| TW | 201421442 A | 6/2014 |
| TW | 201523561 A | 6/2015 |

OTHER PUBLICATIONS

Office Action and Search Report dated Jan. 28, 2019, issued in counterpart Taiwanese Patent Application No. 106129401 in Chinese (4 pages) with English summary (2 pages).

3rd Taiwan Office Action dated Nov. 19, 2018, issued in counterpart Taiwanese Patent Application No. 106129401 (12 pages in Chinese) with English summary of Office Action and of Search Report dated Dec. 19, 2017 (2 pages).

Office Action dated Apr. 24, 2019, and Search Report dated Apr. 14, 2019, issued in counterpart Chinese Application No. CN201710797111.3, with 10 pages in Chinese and 1 page English summary.

Office Action dated May 15, 2019, and Search Report dated May 7, 2019, issued in counterpart Chinese Application No. CN201710797114.7, with 8 pages in Chinese and 1 page English summary.

Office Action and Search Report dated May 13, 2019, in counterpart Chinese Application No. CN201710822821.7, with 10 pages in Chinese.

Office Action and Search Report dated May 5, 2019, in counterpart Chinese Application No. CN201710778469.1, with 16 pages in Chinese.

* cited by examiner

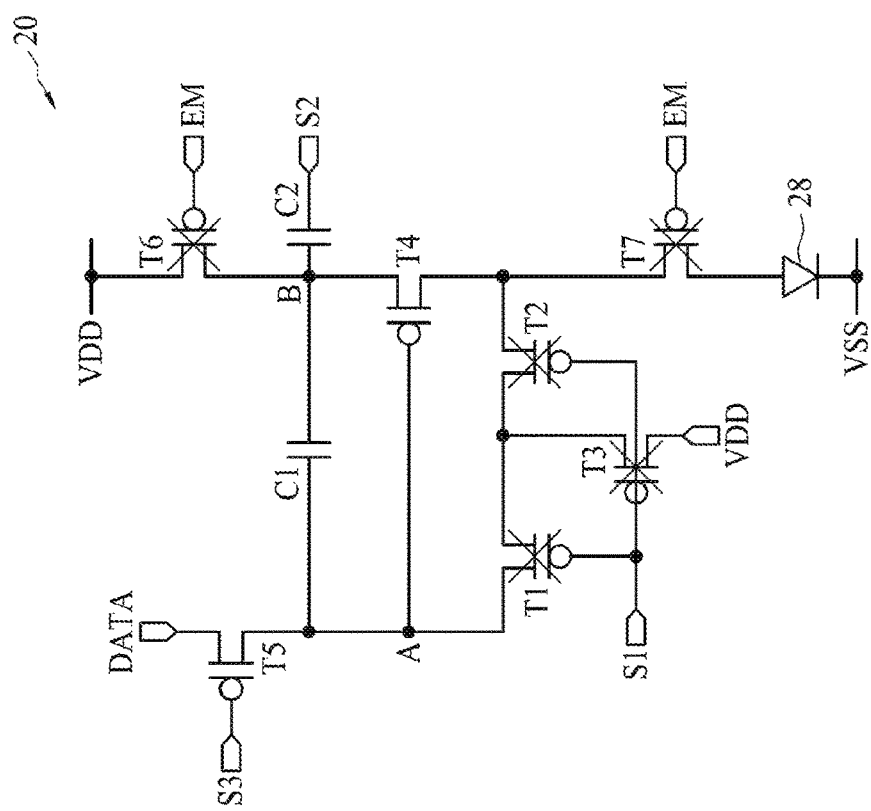
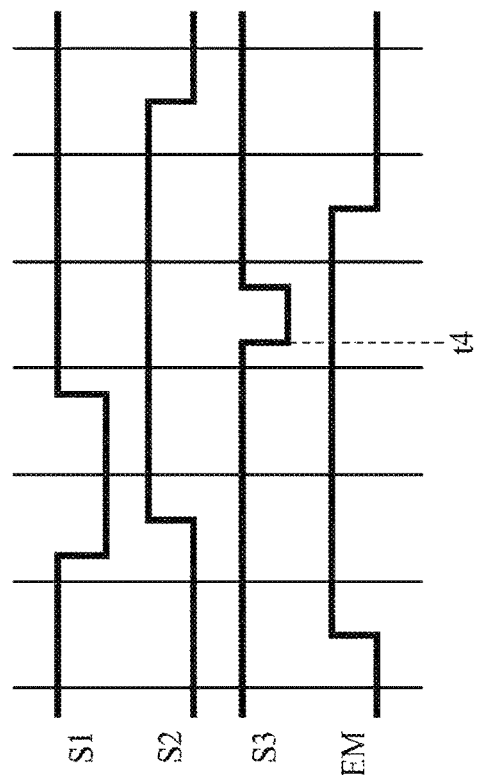
FIG. 4B
FIG. 4A

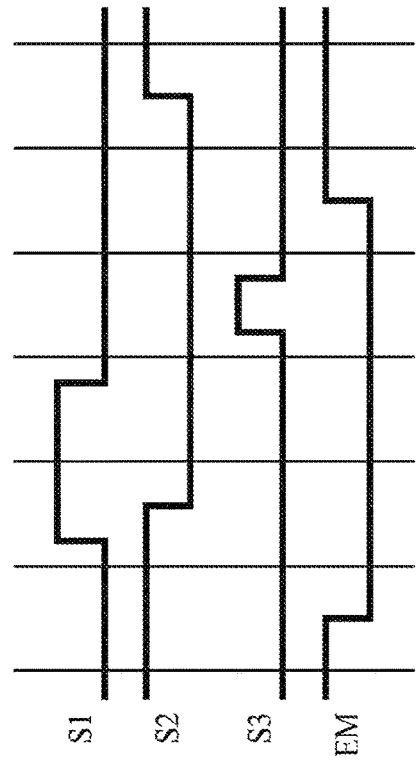
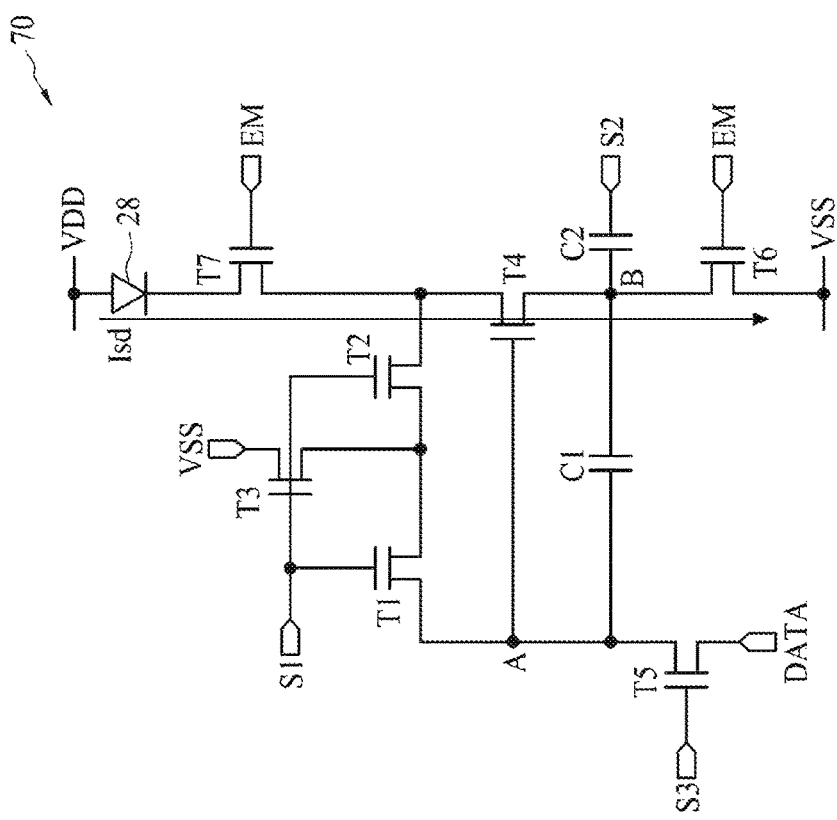
FIG. 7B
FIG. 7A

PIXEL CIRCUIT AND ELECTROLUMINESCENT DISPLAY COMPRISING THE PIXEL CIRCUIT

CROSS REFERENCE TO RELATED APPLICATIONS

This application claims priority to U.S. provisional application Ser. No. 62/421,435, filed Nov. 14, 2016, the disclosure of which is hereby incorporated herein by reference.

BACKGROUND

An electroluminescent (EL) display, such as an active matrix organic light emitting diode (AMOLED) display, may include an array of pixels. Each of the pixels may include an EL device, a switching transistor for transfer data that contains information on luminescence, and a driving transistor for driving the EL device to emit light according to the data. While such EL display enjoys the benefit of relatively low power consumption, display non-uniformity may exist among pixels due to process factors in semiconductor manufacturing. It may thus be desirable to have a circuit that solves the problem.

SUMMARY

Embodiments of the present invention provide a circuit that includes an electroluminescent (EL) device, a transistor, a first capacitor and a second capacitor. The transistor, coupled between a supply voltage and the EL device, includes a gate coupled to a first node and a first terminal coupled to a second node. The first capacitor, coupled between the first node and the second node, is configured to reset the gate of the transistor to the supply voltage in response to a first control signal. The second capacitor, including a first end coupled to the second node and a second end to receive a second control signal, is configured to establish at the first terminal of the transistor a compensation voltage associated with a threshold voltage of the transistor in response to the second control signal. The transistor is configured to pass a current through the EL device. The current has a magnitude independent of the threshold voltage of the transistor.

In an embodiment, the circuit further includes a transistor configured to provide the supply voltage to the gate of the transistor in response to the first control signal.

In another embodiment, the circuit further includes a transistor configured to receive data associated with the EL device in response to a third control signal.

In yet another embodiment, the circuit further includes a transistor configured to allow the current to pass through the EL device in response to a fourth control signal.

In still another embodiment, the magnitude of the current is a function of a capacitance each of the first and second capacitors.

In yet still another embodiment, the transistor includes a p-type transistor, and the current is expressed as:

$$|Isd| = k \times \left[ \frac{C2}{C1+C2} \times (VDD - Vdata) \right]^2$$

where Isd represents the magnitude of the current, k is a constant, C1 and C2 represent capacitances of the first and second capacitors, respectively, VDD represents the supply voltage, and Vdata represents a voltage level of data associated with the EL device.

In still yet another embodiment, the transistor includes an n-type transistor, and the current is expressed as:

$$|Isd| = k \times \left[ \frac{C1}{C1+C2} \times (Vdata - VSS) \right]^2$$

where Isd represents the magnitude of the current, k is a constant, C1 and C2 represent capacitances of the first and second capacitors, respectively, VSS represents the supply voltage, and Vdata represents a voltage level of data associated with the EL device.

In an embodiment, a pulse width of the first control signal substantially equals a frame time.

Some embodiments of the present invention provide an electroluminescent display that includes an array of pixel units. Each of the pixel units includes an electroluminescent (EL) device, a transistor, a first capacitor and a second capacitor. The transistor, coupled between a supply voltage and the EL device, includes a gate coupled to a first node and a first terminal coupled to a second node. The first capacitor, coupled between the first node and the second node, is configured to reset the gate of the transistor to the supply voltage in response to a first control signal. The second capacitor, including a first end coupled to the second node and a second end to receive a second control signal, is configured to establish at the first terminal of the transistor a compensation voltage associated with a threshold voltage of the transistor in response to the second control signal. The transistor is configured to pass a current through the EL device. The current has a magnitude independent of the threshold voltage of the transistor.

Embodiments of the present invention also provide a method of voltage compensation in an electroluminescent (EL) display that includes an array of pixel units each including an EL device, a transistor, a first capacitor and a second capacitor. The method comprises resetting a voltage level at a gate of the transistor to a supply voltage in response to a first control signal, establishing a compensation voltage associated with a threshold voltage of the transistor at a first terminal of the transistor in response to a second control signal, storing data associated with the EL device in the first and second capacitors in response to a third control signal, and passing a current through the EL device via the transistor in response to a fourth control signal. The current has a magnitude independent of the threshold voltage the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are diagrams showing a method of operating the circuit illustrated in FIG. 2 in a second phase, in accordance with some embodiments.

FIG. 7A is a circuit diagram of a sub-pixel unit in a display, in accordance with another embodiment.

FIG. 7B is a waveform diagram of control signals for operating the circuit illustrated in FIG. 7A, in accordance with some embodiments.

DETAILED DESCRIPTION

Figure 1:
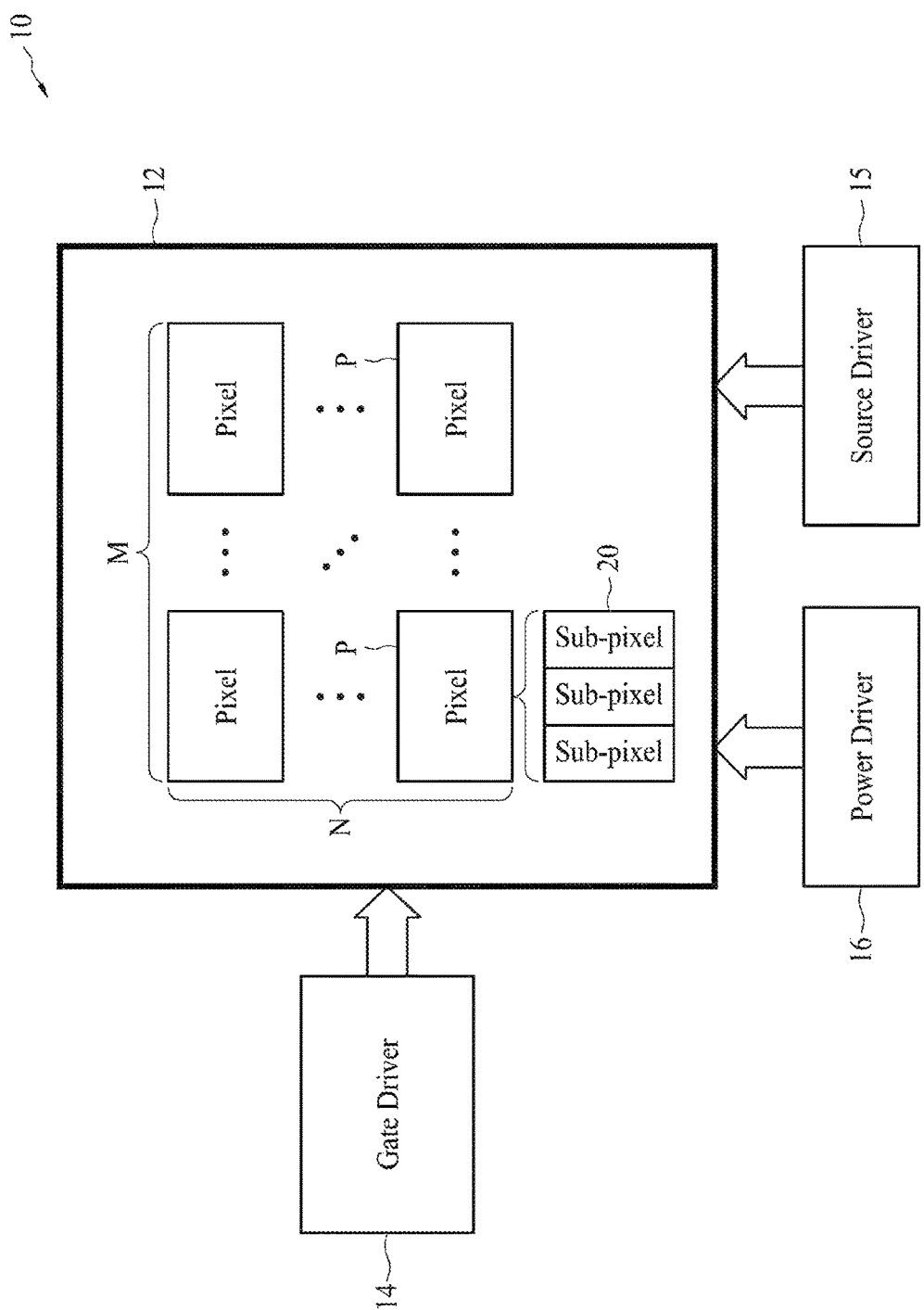
FIG. 1 is a block diagram of a display, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a block diagram of a display 10, in accordance with an embodiment. The display 10 may include an electroluminescent (EL) display, for example, an active matrix organic light emitting diode (AMOLED) display.

Referring to FIG. 1, the display 10 includes an active area 12, a gate driver 14 and a source driver 15. The active area 12 includes an array of pixel units P arranged in, for example, an N×M matrix. The gate driver 14 provides control signals S1, S2, S3 and EM through N scan lines to the N rows of pixel units. The source driver 15 provides data to a selected pixel of the M columns of pixel units. Moreover, a power driver 16 provides supply voltages in a power rail of VDD and VSS to the active area 12. In an embodiment, VDD is approximately five volts (5V), and VSS is approximately −5V.

Each pixel unit P in the active area 12 includes three sub-pixel units, which may be used to display color red (R), color green (G) and color blue (B). In other embodiments, for example, in a sub-pixel rendering (SPR) sensor, the number of sub-pixel units is not limited to three. In the present embodiment, the three sub-pixels are arranged along the row direction. Accordingly, the number of data lines for the source driver 15 is 3×M.

Figure 2:
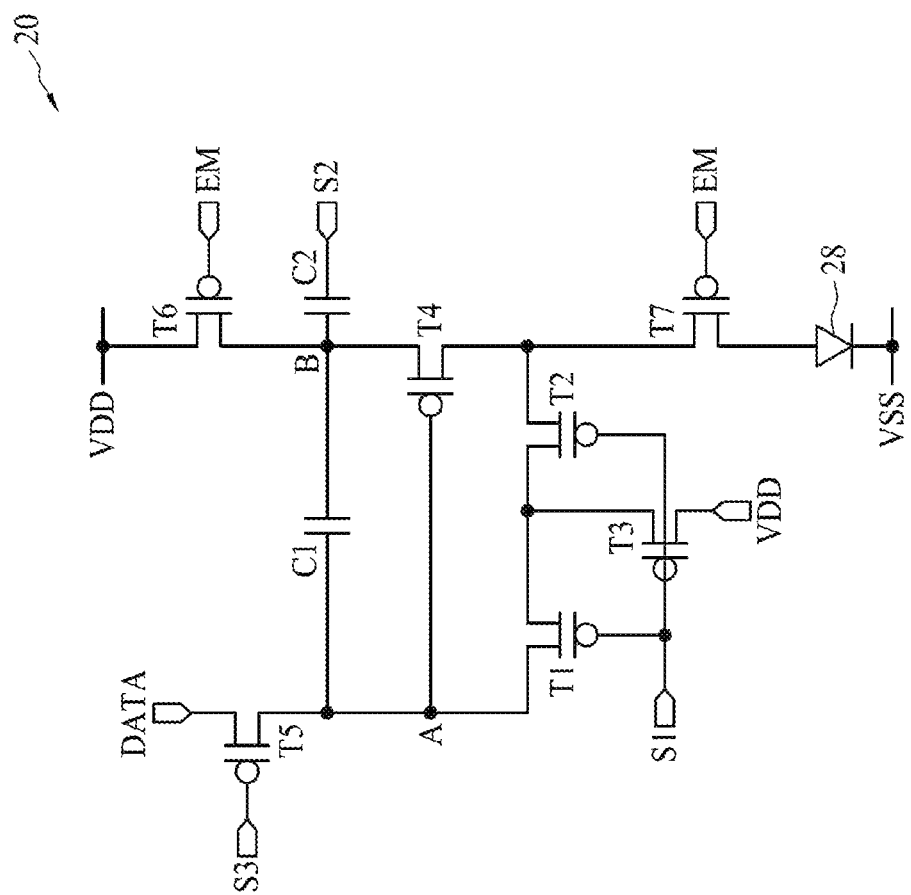
FIG. 2 is a circuit diagram of a sub-pixel unit in the display illustrated in FIG. 1, in accordance with an embodiment.

FIG. 2 is a circuit diagram of an exemplary sub-pixel unit 20 in the display 10 illustrated in FIG. 1, in accordance with an embodiment.

Referring to FIG. 2, the circuit includes an EL device 28, transistors T1 to T7, a first capacitor C1 and a second capacitor C2. The EL device 28 includes, for example, a current-driven element that may include an organic light emitting diode (OLED), a micro LED or a quantum dot LED (QLED). The first capacitor C1 and the second capacitor C2 serve as storage capacitors. The transistor T4 serves as a driving transistor to drive the EL device 28 according to data stored in the capacitors C1 and C2. In the present embodiment, each of the transistors T1 to T7 includes a p-type thin film transistor (TFT) or a p-type metal-oxide-semiconductor (PMOS) transistor.

A gate of the transistor T1 receives a first control signal S1. A drain of the transistor T1 is coupled to a first node A. In addition, a gate of the transistor T3 also receives the first control signal S1. A source of the transistor T3 receives a supply voltage VDD. A drain of the transistor T3 is coupled to a source of the transistor T1. Persons having ordinary skill in the art will understand that drain and source terminals of a MOS transistor may be interchangeable, depending on voltage levels applied thereto.

Moreover, a gate of the transistor T2 also receives the first control signal S1. A source of the transistor T2 is coupled to the source of the transistor T1 and hence the drain of the transistor T3. A gate of the transistor T4 is coupled to the first node A and hence the drain of the transistor T1. A source of the transistor T4 is coupled to a second node B. A drain of the transistor T4 is coupled to a drain of the transistor T2.

The first capacitor C1 is coupled between the first node A and the second node B. In addition, the second capacitor C2 has a first end coupled to the second node B, and a second end configured to receive a second control signal S2.

Furthermore, a gate of the transistor T5 receives a third control signal S3. A source of the transistor T5 receives data (labeled "DATA") on a corresponding data line from the source driver 15. A drain of the transistor T5 is coupled to the first node A and hence the gate of the transistor T4 and the drain of the transistor T1. In addition, a gate each of the transistors T6 and T7 receives a fourth control signal EM. A source of the transistor T6 receives VDD. A drain of the transistor T6 is coupled to the second node B and hence the source of the transistor T4. Moreover, a source of the transistor T7 is coupled to the drain each of the transistors T2 and T4. A drain of the transistor T7 is coupled to an anode of the EL device 28. A cathode of the EL device 28 receives another supply voltage VSS.

Figure 3B:
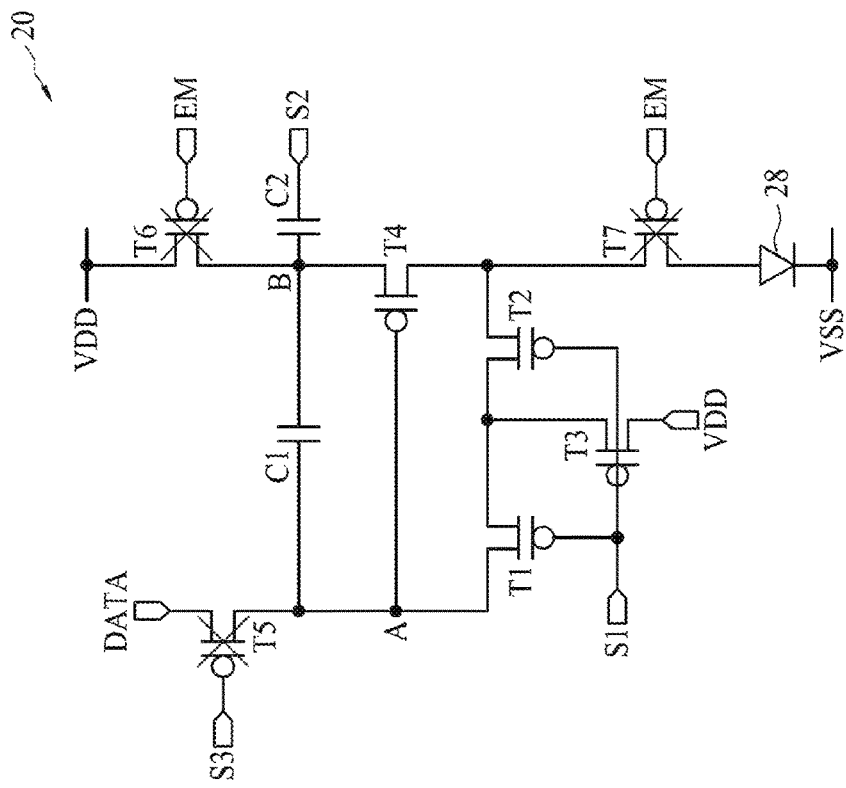
FIGS. 3A and 3B are diagrams showing a method of operating the circuit illustrated in FIG. 2 in a first phase, in accordance with some embodiments.
Figure 3A:
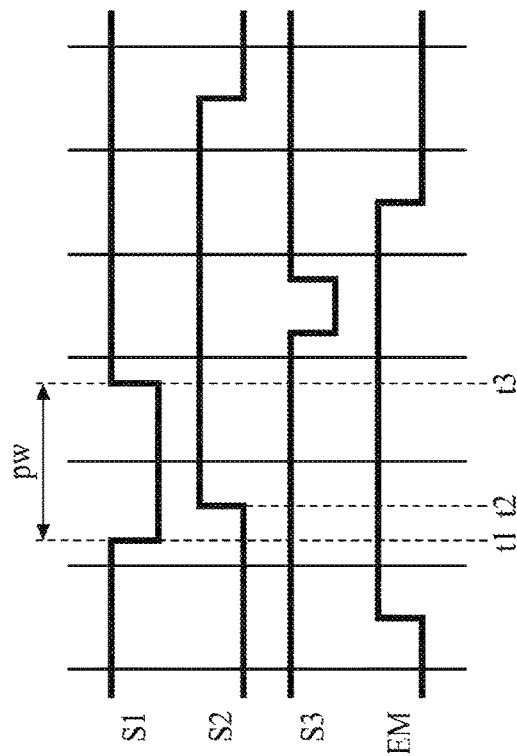

FIGS. 3A and 3B are diagrams showing a method of operating the circuit 20 illustrated in FIG. 2 in a first phase, in accordance with some embodiments.

Referring to FIG. 3A, the control signals S1, S3 and EM are configured to be active low in view of the p-type transistors T1 to T7. At time t1, the first control signal S1 is asserted at a falling edge, the second control signal S2 is kept at a low logical level, and the third and fourth control signals S3 and EM at a high logical level are not asserted. As a result, referring to FIG. 3B, the transistors T1, T2 and T3 are turned on, while the transistors T5 to T7 are turned off (a cross sign "X" labeled). Since the transistors T1 and T3 are turned on, a voltage level at the first node A, denoted as VA, is pulled high to VDD. Moreover, in a previous phase (a third phase to be discussed in FIGS. 5A and 5B), a voltage level at node B, denoted as VB, is VDD (as the transistor T6 is turned on) and is kept initially in the first phase. Since a voltage level at the gate and source (denoted as Vg and Vs, respectively) of the driving transistor T4 is VDD, the transistor T4 is turned off.

At time t2, the second control signal S2 becomes logically high, the first control signal S1 is kept at a low logical level, and the third and fourth control signals S3 and EM are not asserted. With the transition of the second control signal S2 from low to high at time t2, by the coupling function of the second capacitor C2, VB initially at VDD is pulled up to a level higher than VDD+|Vth4|, where |Vth4| is the threshold voltage of the transistor T4. The transistor T4 is then turned on. As a result, during the first phase, VA (or Vg of the transistor T4) is reset to VDD. Moreover, a compensation voltage is established at VB (or Vs of the transistor T4). VB or Vs can reach a desirable value of VDD+|Vth4| by means of adjusting a pulse width pw of the first control signal S1. The pulse width pw of the first control signal S1 is a time period that the first control signal S1 stays activated. For example, in the present embodiment as illustrated in FIG. 3A, the pulse width pw of the first control signal S1 is from time t1 to t3. In the present embodiment, |Vth4| associated with the driving transistor T4 represents a compensation voltage. The time for establishing the compensation voltage, hereinafter "the compensation time," is positively proportional to the pulse width pw of the first control signal S1. Moreover, the pulse width pw of the first control signal S1 is not limited by the resolution of the display 10. As the compensation time becomes longer, the voltage level of VB reaches closer to the saturation voltage of the second capacitor C2, which enhances the display quality of the display 10. Effectively, the compensation time, or the pulse width pw, can be as long as a frame time.

FIGS. 4A and 4B are diagrams showing a method of operating the circuit 20 illustrated in FIG. 2 in a second phase, in accordance with some embodiments.

Referring to FIG. 4A, at time t4, the third control signal S3 is asserted at a falling edge, the second control signal S2 is kept at a high logical level, and the first and fourth control signals S1 and EM are not asserted. As a result, referring to FIG. 4B, the transistor T5 is turned on, the transistors T1 to T3 are turned off, and the transistors T6 and T7 are kept at an off state. Since the transistor T5 is turned on, data is written to the first node A. Accordingly, VA (Vg) becomes Vdata. In addition, as VA changes from VDD (first phase) to Vdata (second phase), by the coupling function of the first capacitor C1, VB becomes $$VDD + |Vth4| + \left[\frac{C1}{C1+C2} \times (Vdata - VDD)\right].$$

For convenience, a same reference numeral or label for a capacitor is also used for its capacitance throughout the disclosure, and vice versa. For example, while the reference label "C1" as above mentioned refers to the first capacitor, it may also represent the capacitance of the first capacitor.

Figure 5B:
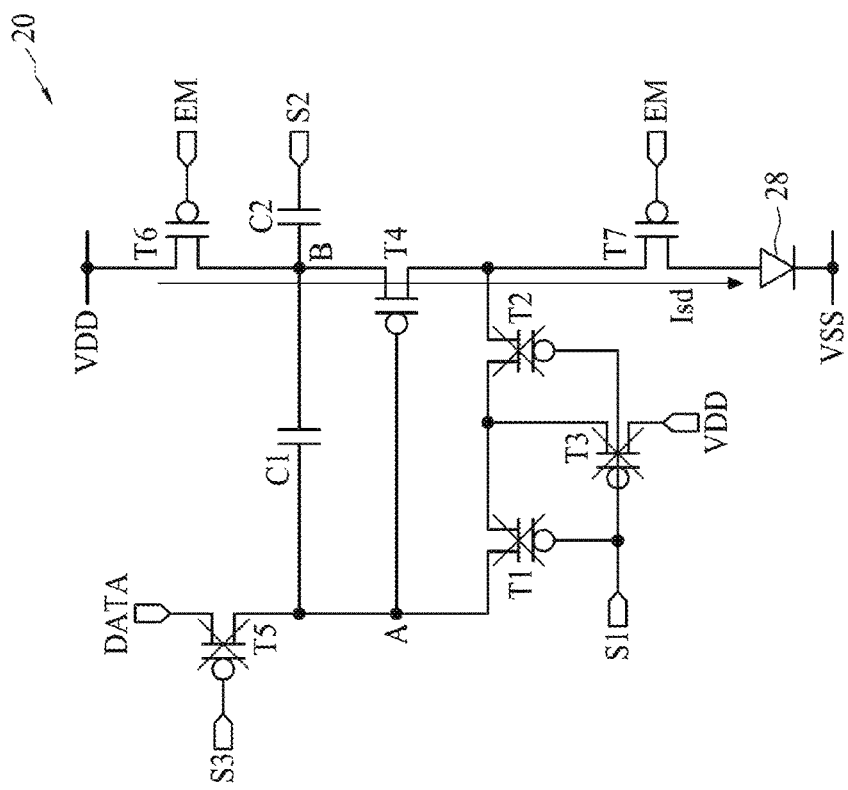
FIGS. 5A and 5B are diagrams showing a method of operating the circuit illustrated in FIG. 2 in a third phase, in accordance with some embodiments.
Figure 5A:
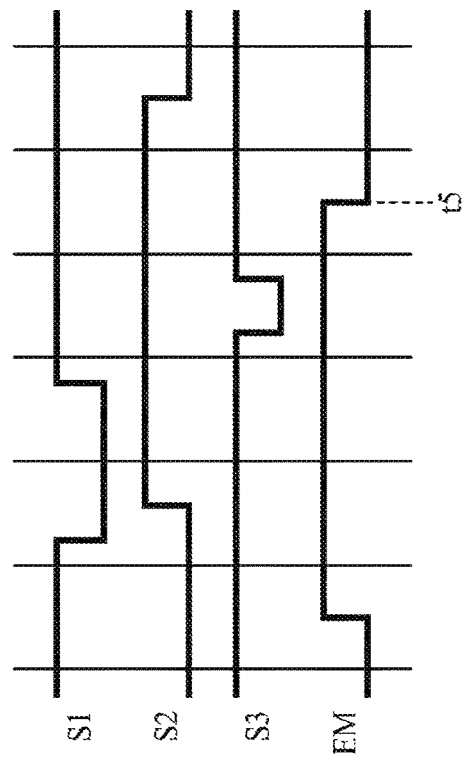

FIGS. 5A and 5B are diagrams showing a method of operating the circuit 20 illustrated in FIG. 2 in a third phase, in accordance with some embodiments.

Referring to FIG. 5A, at time t5, the fourth control signal EM is asserted at a falling edge, the second control signal S2 is kept at a high logical level, and the first and third control signals S1 and S3 are not asserted. As a result, referring to FIG. 5B, the transistors T6 and T7 are turned on, the transistor T5 is turned off, and the transistors T1 to T3 are kept at an off state. Since the transistor T6 is turned on, VB (Vs) is pulled to VDD from $$VDD + |Vth4| + \left[\frac{C1}{C1+C2} \times (Vdata - VDD)\right].$$

By the function of the first capacitor C1, VA (Vg) becomes $$Vdata - \left\{|Vth4| + \left[\frac{C1}{C1+C2} \times (Vdata - VDD)\right]\right\}.$$

Moreover, a current Isd flows from supply power VDD through the EL device 28 to VSS via the transistors T6, T4 and T7. The current Isd can be expressed in equation (1) below.

$$|Isd| = k \times (|Vsg| - |Vth4|)^2 \quad\quad \text{equation (1)}$$

where k is a constant, Vsg represents a source to gate voltage of the transistor T4.

Since $$Vsg = Vs - Vg = VB - VA = |Vth4| + \left[\frac{C2}{C1+C2} \times (VDD - Vdata)\right],$$

by substituting the result into equation (1), the current Isd is rewritten as follows.

$$|Isd| = k \times \left[\frac{C2}{C1+C2} \times (VDD - Vdata)\right]^2 \quad\quad \text{equation (2)}$$

The current Isd is independent of the threshold voltage of the transistor T4. Since equation (2) is free of the Vth term, the display quality of the display 10 is enhanced.

Figure 6:
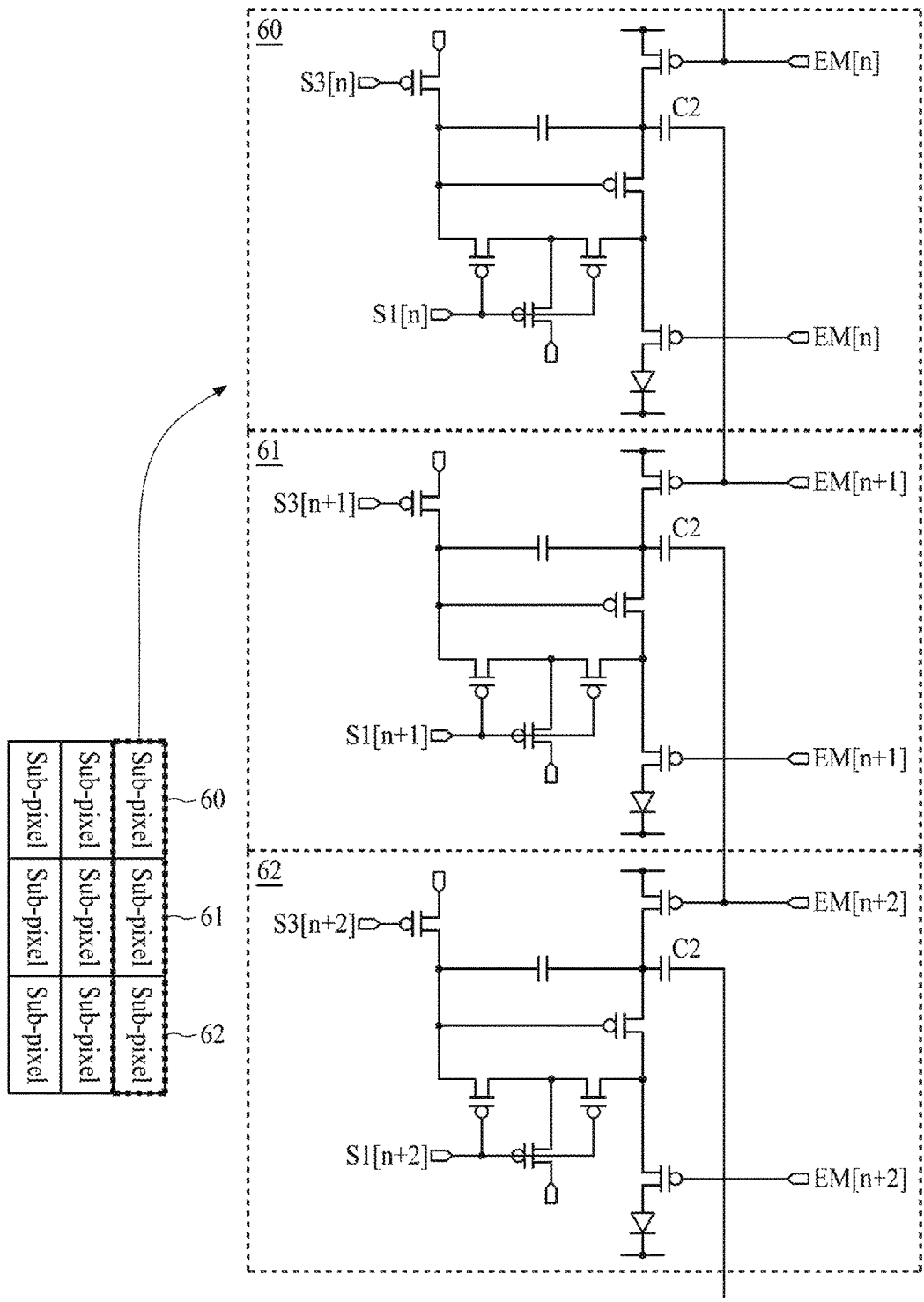
FIG. 6 is a diagram of a circuit structure of sub-pixel units, in accordance with some embodiments.

FIG. 6 is a diagram of a circuit structure of sub-pixel units, in accordance with some embodiments. Referring to FIG. 6, the circuit structure is similar to that described and illustrated with reference to FIG. 2 except that, for example, sub-pixel units arranged along the column direction are configured to receive a fourth control signal EM, that is provided to an immediately adjacent sub-pixel unit on a next row, as a second control signal S2. For discussion, only exemplary sub-pixel units 60, 61 and 62 are shown. As a result, a second control signal S2[n] that would otherwise be provided to a sub-pixel unit on an n-th row as in FIG. 3A, 4A or 5A is replaced by a fourth control signal EM[n+1] provided to a sub-pixel unit on an (n+1)-th row. Specifically, for the sub-pixel unit 60, a fourth control signal EM[n+1] provided to the sub-pixel unit 61 also serves as a second control signal coupled to the second terminal of the second capacitor C2 in the sub-pixel unit 60. In addition, for the sub-pixel unit 61, a fourth control signal EM[n+2] provided to the sub-pixel unit 62 also serves as a second control signal coupled to the second terminal of the second capacitor C2 in the sub-pixel unit 61. Effectively, the control mechanism is simplified.

FIG. 7A is a circuit diagram of a sub-pixel unit 70 in a display, in accordance with another embodiment.

Referring to FIG. 7A, the circuit is similar to the circuit described and illustrated with reference to FIG. 2 except that, for example, n-type TFTs or NMOS transistors replace the p-type TFTs or PMOS transistors T1 to T7 in FIG. 2.

Specifically, a gate of the transistor T1 receives a first control signal S1. A drain of the transistor T1 is coupled to a first node A. In addition, a gate of the transistor T3 also receives the first control signal S1. A source of the transistor T3 receives VSS. A drain of the transistor T3 is coupled to a source of the transistor T1. Moreover, a gate of the transistor T2 also receives the first control signal S1. A source of the transistor T2 is coupled to the source of the transistor T1 and hence the drain of the transistor T3. A gate of the transistor T4 is coupled to the first node A and hence the drain of the transistor T1. A source of the transistor T4 is coupled to a second node B. A drain of the transistor T4 is coupled to a drain of the transistor T2.

The first capacitor C1 is coupled between the first node A and the second node B. In addition, the second capacitor C2 has a first terminal coupled to the second node B, and a second terminal to receive a second control signal S2.

Furthermore, a gate of the transistor T5 receives a third control signal S3. A drain of the transistor T5 receives data (labeled "DATA") on a corresponding data line from the source driver 15. A source of the transistor T5 is coupled to the first node A and hence the gate of the transistor T4 and the drain of the transistor T1. In addition, a gate each of the transistors T6 and T7 receives a fourth control signal EM. A source of the transistor T6 receives VSS. A drain of the transistor T6 is coupled to the second node B and hence the source of the transistor T4. Moreover, a source of the transistor T7 is coupled to the drain each of the transistors T2 and T4. A drain of the transistor T7 is coupled to a cathode of the EL device 28. An anode of the EL device 28 is coupled to VDD.

FIG. 7B is a timing diagram for operating the circuit illustrated in FIG. 7A, in accordance with some embodiments.

Referring to FIG. 7B, the control signals S1, S3 and EM are similar to those described and illustrated with reference to FIG. 3A, 4A or 5A except that, for example, the control signals S1, S3 and EM in FIG. 7B are active high or asserted at a rising edge in view of n-type transistors T1 to T7, while the second control signal S2 has an inverted phase as compared to that illustrated in FIG. 3A, 4A or 5A.

The current Isd flowing through the EL device 28 in FIG. 7A can be expressed in equation (3) below.

$$|Isd| = k \times (|Vgs| - |Vth4|)^2 = k \times \left[\frac{C1}{C1+C2} \times (Vdata - VSS)\right]^2 \quad \text{equation (3)}$$

Similarly, the current Isd is independent of the threshold voltage of the transistor T4. Since equation (3) is free of the Vth term, the display quality of the display 10 is enhanced. Moreover, the simplified control mechanism as described and illustrated with reference to FIG. 6 is also applicable to the sub-pixel unit 70 in FIG. 7A.

Figure 8:
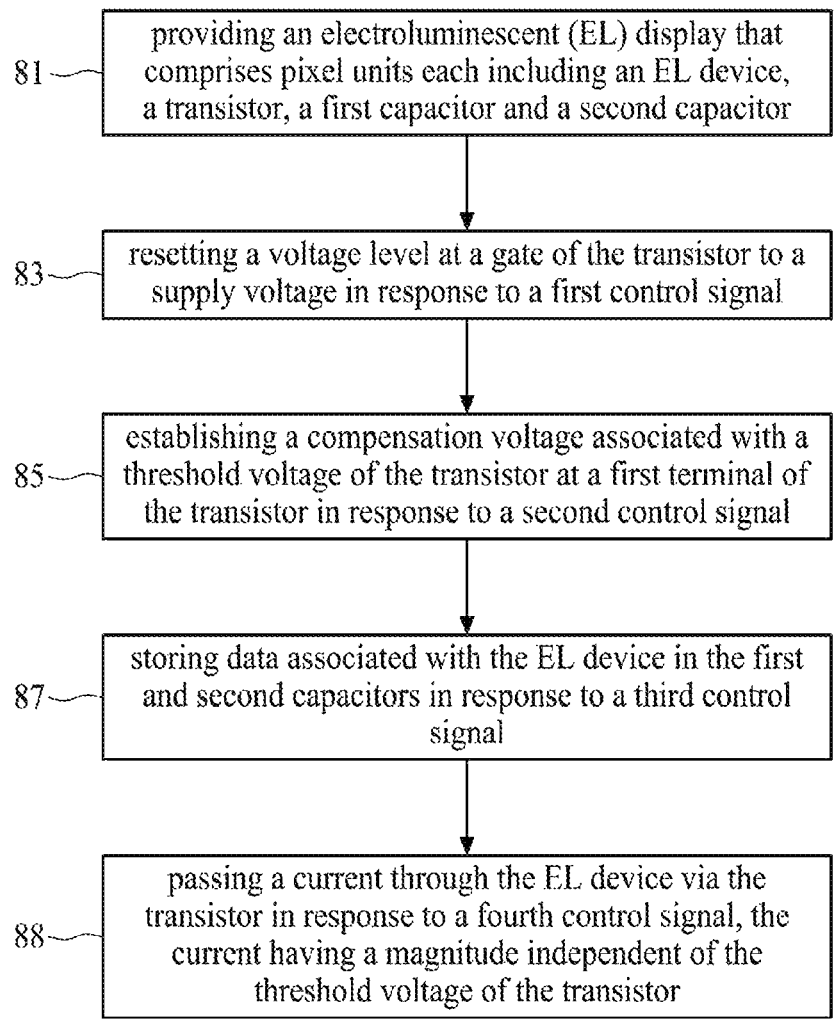
FIG. 8 is a flow diagram showing a method of voltage compensation in an electroluminescent display.

FIG. 8 is a flow diagram showing a method of voltage compensation in an electroluminescent display.

Referring to FIG. 8, in operation 81, an electroluminescent (EL) display is provided. The EL display includes an array of pixel units each including an EL device, a transistor, a first capacitor and a second capacitor.

Next, in operation 83, a voltage level at a gate of the transistor is reset to a supply voltage in response to a first control signal.

In operation 85, a compensation voltage associated with a threshold voltage of the transistor is established at a first terminal of the transistor in response to a second control signal.

In operation 87, data associated with the EL device is stored in the first and second capacitors in response to a third control signal.

Subsequently, in operation 88, a current is passed through the EL device via the transistor in response to a fourth control signal. The current has a magnitude independent of the threshold voltage the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   an electroluminescent (EL) device;
   a first transistor, coupled between a supply voltage and the EL device, the first transistor including a first terminal, a gate coupled to a first node and a second terminal coupled to a second node;
   a second transistor, wherein a gate of the second transistor is coupled to a first control signal, and a first terminal of the second transistor is coupled to the first node;
   a third transistor, wherein a gate of the third transistor is coupled to the first control signal, a first terminal of the third transistor is coupled to the first terminal of the first transistor, and a second terminal of the third transistor is coupled to a second terminal of the second transistor;
   a fourth transistor, configured to receive the supply voltage, and provide the supply voltage to each of the gate of the first transistor and the first terminal of the first transistor though a same number of transistors, wherein a gate of the fourth transistor is coupled to the first control signal, a first terminal of the fourth transistor is coupled to the second terminal of the second transistor, and a second terminal of the fourth transistor is coupled to the supply voltage;
   a first capacitor, coupled between the first node and the second node, being configured to reset the gate of the first transistor to the supply voltage in response to the first control signal; and
   a second capacitor including a first end coupled to the second node and a second end to receive a second control signal, the second capacitor being configured to establish at the second terminal of the first transistor a compensation voltage associated with a threshold voltage of the first transistor in response to the second control signal,
   wherein the first transistor is configured to pass a current through the EL device, the current having a magnitude being independent of the threshold voltage of the first transistor.

2. The circuit according to claim 1, wherein the second transistor is configured to provide the supply voltage to the gate of the first transistor in response to the first control signal.

3. The circuit according to claim 1 further comprising a fifth transistor configured to receive data associated with the EL device in response to a third control signal.

4. The circuit according to claim 1 further comprising a fifth transistor configured to allow the current to pass through the EL device in response to a fourth control signal.

5. The circuit according to claim 1, wherein the magnitude of the current is a function of a capacitance each of the first and second capacitors.

6. The circuit according to claim 1, wherein the first transistor includes a p-type transistor, and the current is expressed as:

$$|Isd| = k \times \left[ \frac{C2}{C1+C2} \times (VDD - Vdata) \right]^2$$

where Isd represents the magnitude of the current, k is a constant, C1 and C2 represent capacitances of the first and second capacitors, respectively, VDD represents the supply voltage, and Vdata represents a voltage level of data associated with the EL device.

7. The circuit according to claim 1, wherein the first transistor includes an n-type transistor, and the current is expressed as:

$$|Isd| = k \times \left[ \frac{C1}{C1+C2} \times (Vdata - VSS) \right]^2$$

where Isd represents the magnitude of the current, k is a constant, C1 and C2 represent capacitances of the first and second capacitors, respectively, VSS represents the supply voltage, and Vdata represents a voltage level of data associated with the EL device.

8. The circuit according to claim 1, wherein the circuit is disposed in a display; a pulse width of the first control signal substantially equals a frame time of the display.

9. An electroluminescent display, comprising:
an array of pixel units, each of the pixel units comprising:
an electroluminescent (EL) device;
a first transistor, coupled between a supply voltage and the EL device, the first transistor including a first terminal, a gate coupled to a first node and a second terminal coupled to a second node;
a first capacitor, coupled between the first node and the second node, being configured to reset the gate of the first transistor to the supply voltage in response to a first control signal; and
a second capacitor including a first end coupled to the second node and a second end to receive a second control signal, the second capacitor being configured to establish at the first terminal of the first transistor a compensation voltage associated with a threshold voltage of the first transistor in response to the second control signal,
wherein the first transistor is configured to pass a current through the EL device, the current having a magnitude being independent of a threshold voltage of the first transistor;
wherein the electroluminescent display further comprises a second transistor, and the second transistor is configured to allow the current to pass through the EL device in response to a third control signal;
wherein the array of pixel units includes a first pixel unit on an N-th row of the array and a second pixel unit on an (N+1)-th row of the array and immediately adjacent to the first pixel unit, N being a natural number, and wherein the third control signal provided to the second pixel unit serves as the second control signal for the first pixel unit.

10. The electroluminescent display according to claim 9 further comprising a third transistor configured to provide the supply voltage to the gate of the first transistor in response to the first control signal.

11. The electroluminescent display according to claim 9 further comprising a third transistor configured to receive data associated with the EL device in response to a fourth control signal.

12. The electroluminescent display according to claim 9 further comprising:
a third transistor, wherein a gate of the third transistor is coupled to the first control signal, and a first terminal of the third transistor is coupled to the first node;
a fourth transistor, wherein a gate of the fourth transistor is coupled to the first control signal, a first terminal of the fourth transistor is coupled to the first terminal of the first transistor, and a second terminal of the fourth transistor is coupled to a second terminal of the third transistor; and
a fifth transistor, wherein a gate of the fifth transistor is coupled to the first control signal, a first terminal of the fifth transistor is coupled to the second terminal of the third transistor, and a second terminal of the fifth transistor is coupled to the supply voltage.

13. The electroluminescent display according to claim 9, wherein the magnitude of the current is a function of a capacitance each of the first and second capacitors.

14. The electroluminescent display according to claim 9, wherein the transistor includes a p-type transistor, and the current is expressed as:

$$|Isd| = k \times \left[ \frac{C2}{C1+C2} \times (VDD - Vdata) \right]^2$$

where Isd represents the magnitude of the current, k is a constant, C1 and C2 represent capacitances of the first and second capacitors, respectively, VDD represents the supply voltage, and Vdata represents a voltage level of data associated with the EL device.

15. The electroluminescent display according to claim 9, wherein the first transistor includes an n-type transistor, and the current is expressed as:

$$|Isd| = k \times \left[ \frac{C1}{C1+C2} \times (Vdata - VSS) \right]^2$$

where Isd represents the magnitude of the current, k is a constant, C1 and C2 represent capacitances of the first and second capacitors, respectively, VSS represents the supply voltage, and Vdata represents a voltage level of data associated with the EL device.

16. The electroluminescent display according to claim 9, wherein a pulse width of the first control signal substantially equals a frame time of the electroluminescent display.

17. A method of voltage compensation in an electroluminescent (EL) display that comprises an array of pixel units each including an EL device, a first transistor, a first capacitor and a second capacitor, the method comprising:

resetting a voltage level at a gate of the first transistor to a supply voltage in response to a first control signal;

establishing a compensation voltage associated with a threshold voltage of the first transistor at a first terminal of the first transistor in response to a second control signal;

storing data associated with the EL device in the first and second capacitors in response to a third control signal; and passing a current through the EL device via the first transistor in response to a fourth control signal, the current having a magnitude independent of the threshold voltage the first transistor;

wherein the array of pixel units includes a first pixel unit on an N-th row of the array and a second pixel unit on an (N+1)-th row of the array and immediately adjacent to the first pixel unit, N is a natural number, and the method further comprises:

using the fourth control signal provided to the second pixel unit as the second control signal for the first pixel unit.

18. The method according to claim 17, wherein each pixel unit in the array of pixel units further comprises a second transistor, a third transistor and a fourth transistor, the second transistor is different from the third transistor, and the fourth transistor is coupled to the supply voltage; the step of resetting the voltage level at the gate of the first transistor to the supply voltage in response to the first control signal:

turning on the second transistor, the third transistor and the fourth transistor in response to the first control signal, coupling the supply voltage to the gate of the first transistor through the fourth transistor and the second transistor, and coupling the supply voltage to a second.

19. The method according to claim 17, further comprising:

providing the first control signal having a pulse width substantially equal to a frame time of the electroluminescent display.

* * * * *